United States Patent
Wu

(10) Patent No.: US 10,541,704 B2
(45) Date of Patent: Jan. 21, 2020

(54) PIPELINED ANALOG-TO-DIGITAL CONVERTER

(71) Applicant: MEDIATEK INC., Hsin-Chu (TW)

(72) Inventor: Tzu-Chien Wu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/285,537

(22) Filed: Feb. 26, 2019

(65) Prior Publication Data

US 2019/0305793 A1 Oct. 3, 2019

Related U.S. Application Data

(60) Provisional application No. 62/651,795, filed on Apr. 3, 2018.

(51) Int. Cl.
| | |
|---|---|
| *H03M 1/38* | (2006.01) |
| *H03M 1/46* | (2006.01) |
| *H03M 1/16* | (2006.01) |
| *H03M 1/40* | (2006.01) |
| *H03M 1/06* | (2006.01) |
| *H03M 1/80* | (2006.01) |

(52) U.S. Cl.
CPC ........... *H03M 1/46* (2013.01); *H03M 1/0675* (2013.01); *H03M 1/167* (2013.01); *H03M 1/403* (2013.01); *H03M 1/804* (2013.01)

(58) Field of Classification Search
CPC ...... H03M 1/46; H03M 1/0675; H03M 1/167; H03M 1/667; H03M 1/009
USPC .................. 341/155, 159, 120, 118, 161, 163
See application file for complete search history.

(56) References Cited

U.S. PATENT DOCUMENTS

| | | | |
|---|---|---|---|
| 6,859,159 B2 * | 2/2005 | Michalski | ............ H03H 19/004 |
| | | | 341/136 |
| 7,486,216 B2 * | 2/2009 | Lee | ........................ H03M 1/002 |
| | | | 341/155 |
| 8,643,529 B2 | 2/2014 | Lin | |

FOREIGN PATENT DOCUMENTS

KR 101711542 * 3/2017 .............. H03M 1/46

OTHER PUBLICATIONS

Lee, C.C., et al.; "A SAR-Assisted Two-Stage Pipeline ADC;" IEEE Journal of Solid-State Circuits; vol. 46; No. 4; Apr. 2011; pp. 859-869.

* cited by examiner

*Primary Examiner* — Peguy Jean Pierre
(74) *Attorney, Agent, or Firm* — McClure, Qualey & Rodack, LLP

(57) ABSTRACT

A pipelined analog-to-digital converter (ADC) using a multiplying digital-to-analog converter (MDAC) and two sub-range analog-to-digital converters (sub-range ADCs) is disclosed. The MDAC samples an analog input and performs multiplication on the sampled analog input based on control bits. The first sub-range ADC provides the MDAC with the control bits. The second sub-range ADC is coupled to the MDAC for conversion of a multiplied signal output from the MDAC. The first sub-range ADC samples the analog input to generate the control bits for the MDAC as well as pre-estimated bits for the second sub-range ADC. The second sub-range ADC operates based on the pre-estimated bits and thereby a first section of digital bits are generated by the second sub-range ADC. A second section of digital bits are provided by the first sub-range ADC. The first and second sections of digital bits represent the analog input.

17 Claims, 6 Drawing Sheets

PIPELINED ANALOG-TO-DIGITAL CONVERTER

CROSS REFERENCE TO RELATED APPLICATIONS

This application claims the benefit of U.S. Provisional Application No. 62/651,795, filed Apr. 3, 2018, the entirety of which is incorporated by reference herein.

BACKGROUND OF THE INVENTION

Field of the Invention

The present invention relates to analog-to-digital converters (ADCs).

Description of the Related Art

In electronics, an analog-to-digital converter (ADC) converts an analog input to generate digital representation of the analog input. To achieve high-speed conversion, a pipelined ADC architecture is proposed.

FIG. 1 depicts an example of a pipelined ADC 100, which includes an MDAC (multiplying digital-to-analog converter) 102, an M-bit ADC 104 and a Z-bit ADC 106. In phase Φ1, the analog input Vj is sampled by the MDAC 102 and the M-bit ADC 104. The M-bit ADC 104 outputs a digital signal Dj that includes control bits (b1, b0) to the MDAC 102. In phase Φ2, the MDAC 102 that receives the control bits (b1, b0) performs multiplication on the sampled analog input Vj based on the control bits (b1, b0) and thereby generates a multiplied signal Vj+1. The Z-bit ADC 106 is coupled to the MDAC 102 for conversion of the multiplied signal Vj+1. By converting the multiplied signal Vj+1, digital representation (including Z bits) of the analog input Vj is estimated by the Z-bit ADC 106. When the Z-bit ADC 106 is performing the conversion, the MDAC 102 and the M-bit ADC 104 proceeds to process the next sample of the analog input Vj. A pipelined architecture, therefore, is established. A high-speed ADC is provided.

The pipelined ADC 100, however, may result in low resolution.

FIG. 2 depicts the timing diagram of the pipelined ADC 100. After using phase Φ1 as the sampling phase for the analog input Vj, the digital signal Dj (including control bits b1 and b0) is generated by the M-bit ADC 104 and transferred to the MDAC 102. In phase Φ2, the MDAC 102 operates according to the control bits and, accordingly, performs multiplication on the analog input Vj sampled in phase Φ1. Considering the settling time required for the multiplied signal Vj+1 output by the MDAC 102, the Z-bit ADC 106 takes Ts/2 (phase Φ2) as a sampling phase. The Z-bit ADC 106 does not start the analog-to-digital conversion until the sampling phase (Φ2) for the multiplied signal Vj+1 is completed. The generation of all of the Z bits has to be finished in the following Ts/2. The resolution of the pipelined ADC 100 may be limited.

Considering a high-resolution requirement, a multi-stage architecture may be adopted. The Z bits generated by the Z-ADC 106 may be supplied to another MDAC (in the next stage) and, accordingly, the next stage outputs the lower bits to precisely represent the analog input Vj. However, the multi-stage architecture is complex.

A high-speed and high-resolution ADC with simple design is called for. There are trade-offs in ADC design.

The bit number of the MDAC 102 affecting the closed-loop bandwidth is limited in order to guarantee high-speed operation. Furthermore, mismatch between the sampling circuit of the MDAC 102 and the sampling circuit of the M-bit ADC 104 induces systemic redundancy errors. Thus, the high-resolution requirement has to be satisfied by other components except the MDAC 102, and the significant bit redundancy calibration is more important. The circuit size is large, and more power is consumed. A successive approximation register (SAR) ADC may be a solution for improving power efficiency. However, a SAR ADC with high resolution will slow down the conversion speed of the whole ADC structure.

BRIEF SUMMARY OF THE INVENTION

A sub-range ADC assisted pipelined ADC is introduced.

A pipelined analog-to-digital converter in accordance with an exemplary embodiment of the disclosure comprises a multiplying digital-to-analog converter (MDAC), a first sub-range analog-to-digital converter (sub-range ADC), and a second sub-range ADC. The MDAC samples an analog input and performs multiplication on the sampled analog input based on control bits. The first sub-range ADC provides the MDAC with the control bits. The second sub-range ADC is coupled to the MDAC for conversion of a multiplied signal output from the MDAC. The first sub-range ADC samples the analog input to generate the control bits for the MDAC as well as pre-estimated bits for the second sub-range ADC. The second sub-range ADC operates based on the pre-estimated bits and thereby a first section of digital bits are generated by the second sub-range ADC. A second section of digital bits are provided by the first sub-range ADC. The first and second sections of digital bits form digital bits represent the analog input.

In an exemplary embodiment, the first section of digital bits are least significant bits of the digital bits representing the analog input, and the second section of digital bits are most significant bits of the digital bits representing the analog input. The most significant bits of the digital bits may be formed by the control bits and the pre-estimated bits.

In an exemplary embodiment, the first sub-range ADC generates the pre-estimated bits when the MDAC performs the multiplication. When the second sub-range ADC operates based on the pre-estimated bits, the MDAC and the first sub-range ADC may proceed to the next sample of the analog input.

In an exemplary embodiment, the first and second sub-range ADCs are successive approximation register analog-to-digital converters (SAR ADCs). The pre-estimated bits may be adopted in the second sub-range ADC to skip front-end successive approximation of the second sub-range ADC. The first sub-range ADC may use back-end successive approximation to generate the pre-estimated bits. In another exemplary embodiment, the first sub-range ADC comprises flash comparators, the control bits are generated by the flash comparators. The control bits generated by the flash comparators may be further used in the first sub-range ADC to shorten front-end successive approximation of the first sub-range ADC.

In an exemplary embodiment, the back-end successive approximation of the first sub-range ADC is performed when the MDAC performs the multiplication. When the second sub-range ADC performs back-end successive approximation to generate the first section of digital bits, the MDAC and the first sub-range ADC proceeds to the next sample of the analog input.

After generating the control bits, the first sub-range ADC may use the front-end successive approximation to calibrate errors due to the flash comparators. The first sub-range ADC may further use the back-end successive approximation to calibrate errors due to over-range redundancy. The second sub-range ADC may further use the back-end successive approximation to calibrate errors due to the pre-estimated bits. The second sub-range ADC may further use back-end redundant bit successive approximation to calibrate incomplete settling of successive approximation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
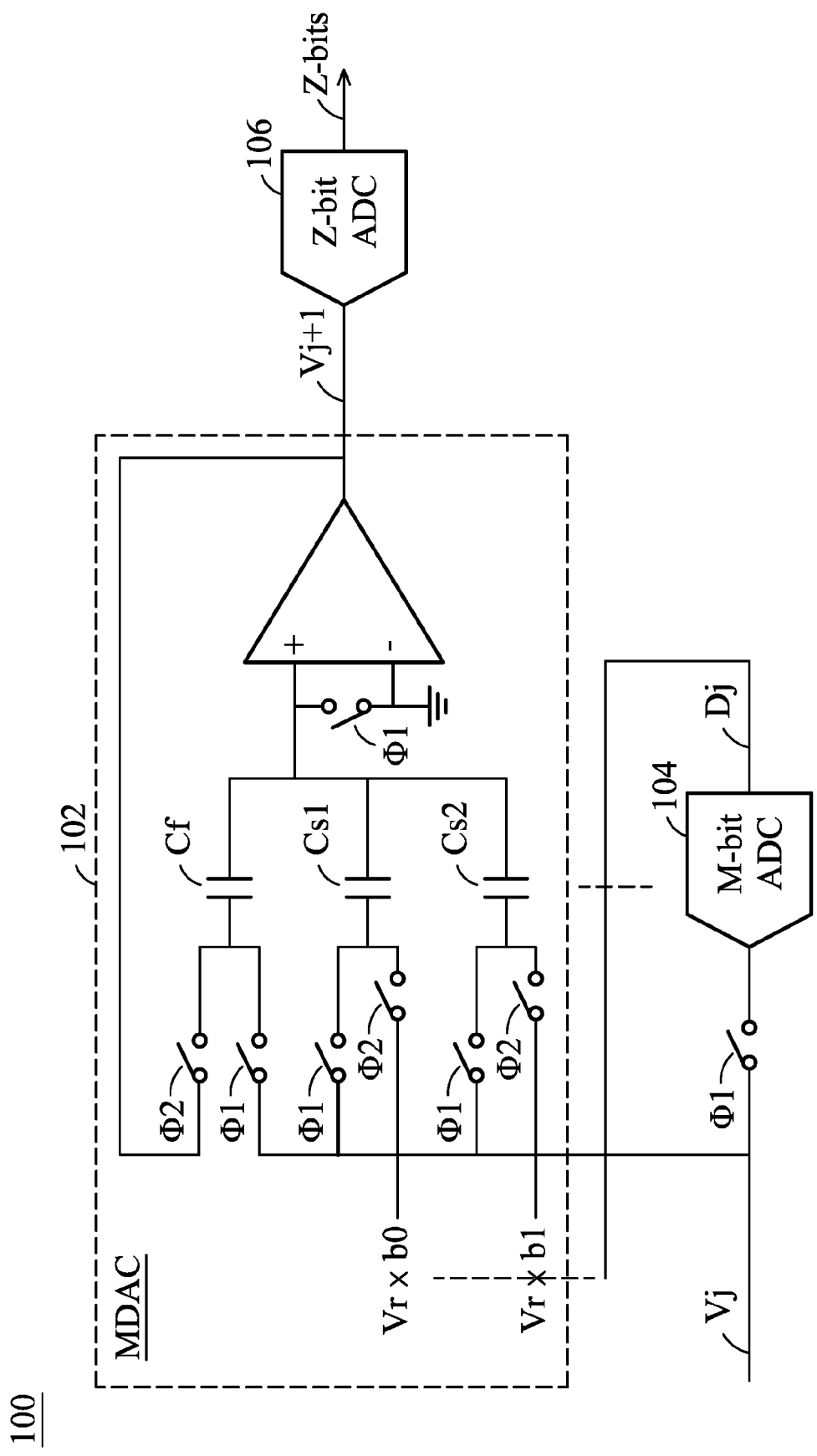
FIG. 1 depicts an example of a pipelined ADC 100, which includes an MDAC (Multiplying digital-to-analog converter) 102, an M-bit ADC 104 and a Z-bit ADC 106.
Figure 2:
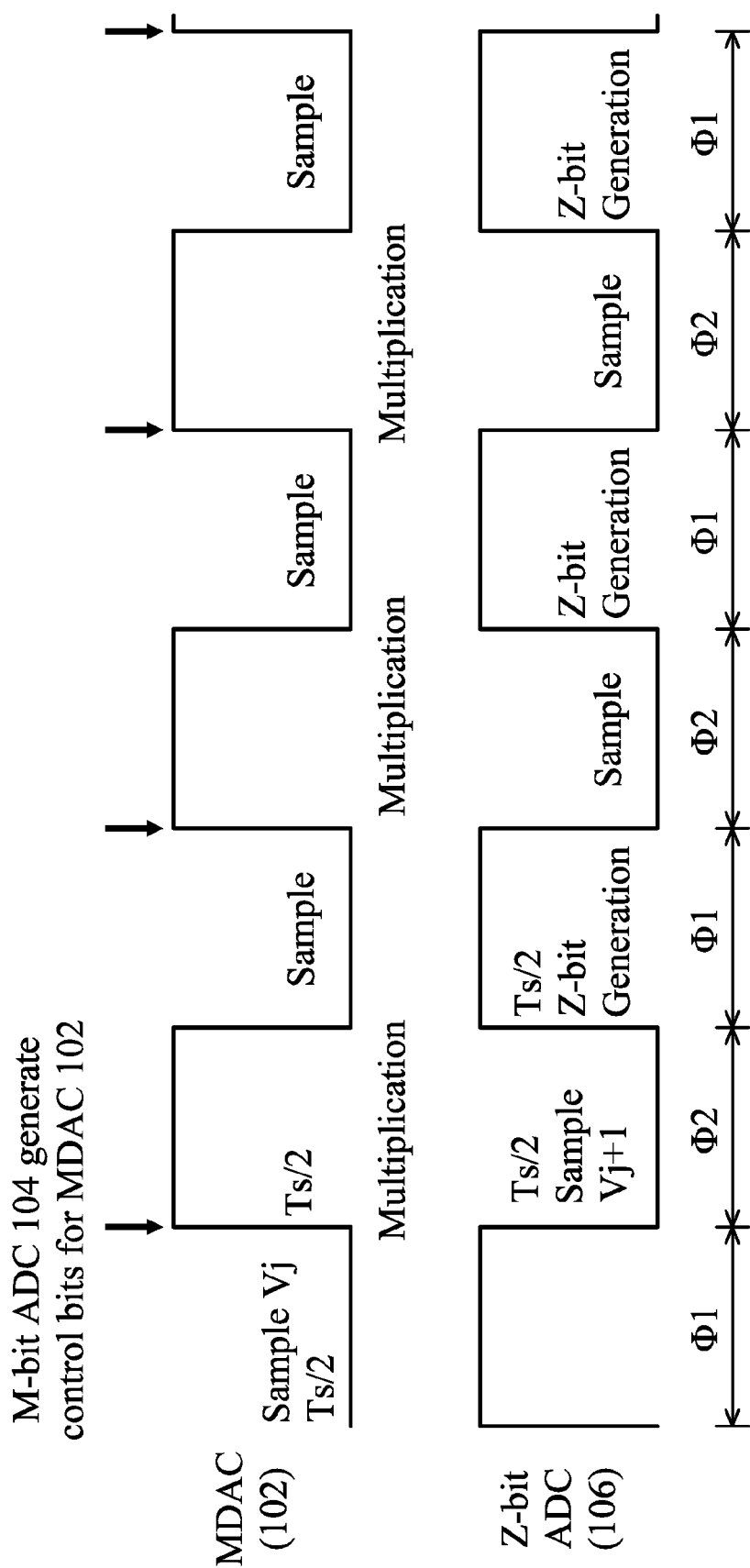
FIG. 2 depicts the timing diagram of the pipelined ADC 100.
Figure 3:
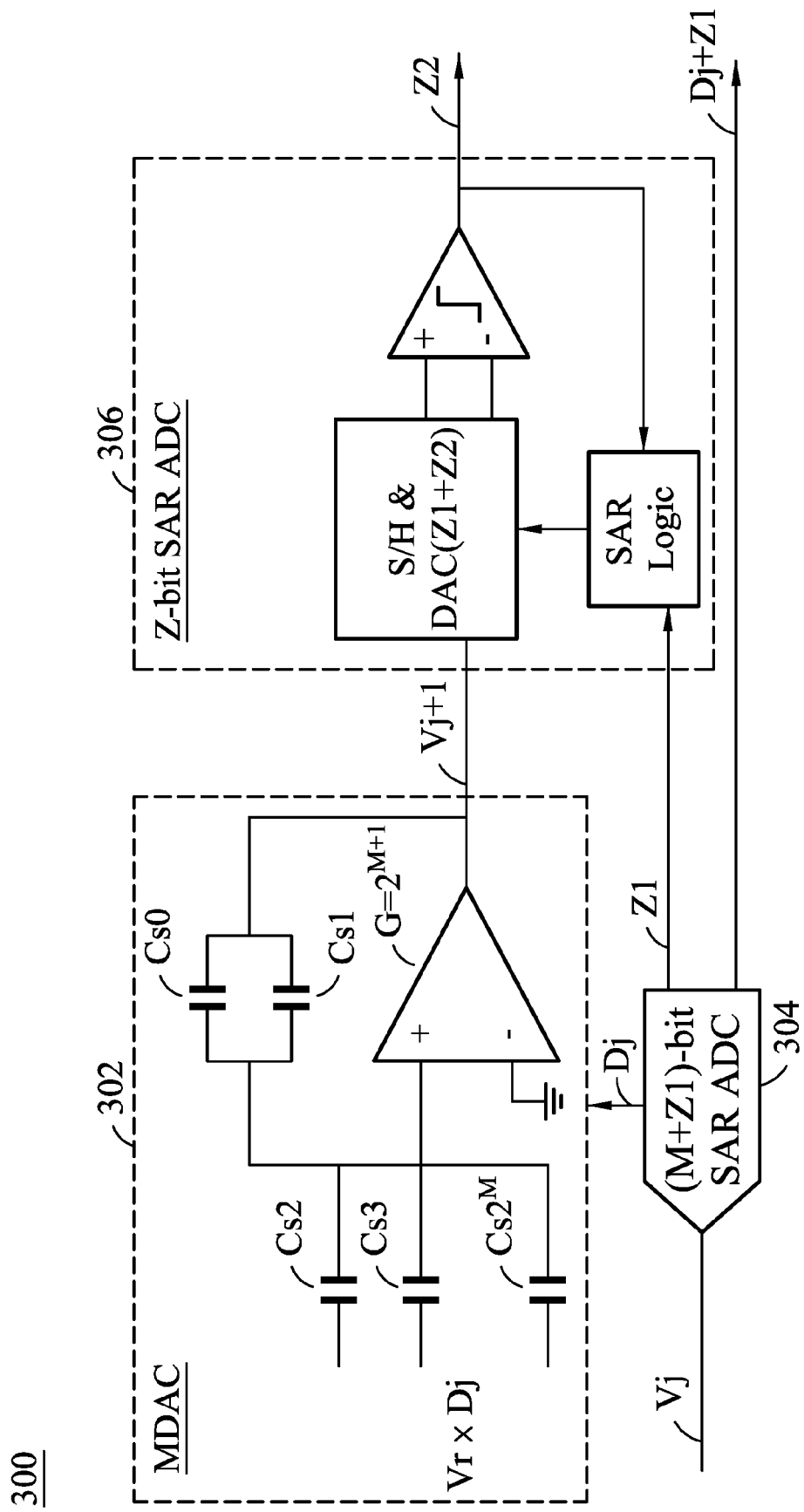
FIG. 3 depicts a pipelined ADC 300 in accordance with an exemplary embodiment of the disclosure, which uses sub-range SAR ADCs and is also named a sub-range SAR ADC assisted pipelined ADC.

FIG. 3 depicts a pipelined ADC 300 in accordance with an exemplary embodiment of the disclosure, which uses sub-range SAR ADCs and is also named a sub-range SAR ADC assisted pipelined ADC.

A SAR ADC (i.e. a successive approximation register analog-to-digital converter) may be implemented by a charge-redistribution technique. A capacitive data acquisition converter (C-DAC) may be used in a SAR ADC. A C-DAC comprises a weighted capacitor array for successive approximation (controlled according to a SAR logic) of a sampled analog input. During the successive approximation, the C-DAC feeds a residual signal to a comparator and the compared results are transferred to the SAR logic to arrange the successive approximation that the C-DAC performs. Through the successive approximation, digital representation of the analog input sampled by the C-DAC is obtained from the series of compared results. SAR ADCs are power efficient but may be time-consuming. The pipelined ADC 300 uses sub-range SAR ADCs as a solution.

As shown, the pipelined ADC 300 includes an MDAC (multiplying digital-to-analog converter) 302, an (M+Z1)-bit SAR ADC 304 and a Z-bit SAR ADC 306. The digital representation of an analog input Vj of the pipelined ADC 300 is formed by the output (the bits forming Dj plus Z1 bits) from the (M+Z1)-bit SAR ADC 304 and the output (Z2 bits) from the Z-bit SAR ADC 306. The two SAR ADCs 304 and 306 each responsible for partial conversion are sub-range SAR ADCs. Specifically, the Z1 bits estimated by the (M+Z1)-bit SAR ADC 304 is further transferred to and adopted by the Z-bit SAR ADC 306. The Z-bit SAR ADC 306 only needs to estimate the remaining (Z−Z1) bits. Not only benefiting from the low power consumption of SAR ADCs, the pre-estimated Z1 bits effectively speeds up the operation of the Z-bit SAR ADC 306.

The details of the operations of the pipelined ADC 300 are described in this paragraph. An analog input Vj is sampled by the MDAC 302 and the (M+Z1)-bit SAR ADC 304. The (M+Z1)-bit SAR ADC 304 outputs a digital signal Dj to the MDAC 302 as control bits. Based on the control bits, the MDAC 302 performs multiplication on the sampled analog input Vj and thereby generates a multiplied signal Vj+1 to be transferred to the Z-bit SAR ADC 306. When the MDAC 302 performs the multiplication to generate the multiplied signal Vj+1, the (M+Z1)-bit SAR ADC 304 proceeds to the estimation of the Z1 bits. The Z1 bits may be regarded as pre-estimated bits and are transferred to the Z-bit SAR ADC 306. When the multiplied signal Vj+1 settles and is sampled by the Z-bit SAR ADC 306, the Z-bit SAR ADC 306 skips the estimation of the Z1 bits and directly starts the estimation of the remaining Z2 bits. In the Z-bit SAR ADC 306, only the successive approximation for obtaining the least significant Z2 bits is required. The higher Z1 bits are pre-estimated by the (M+Z1)-bit SAR ADC 304. When the Z-bit SAR ADC 306 is generating the least significant Z2 bits, the MDAC 302 and the (M+Z1)-bit SAR ADC 304 proceeds to the next sample of the analog input Vj. A pipelined architecture is established.

Figure 4:
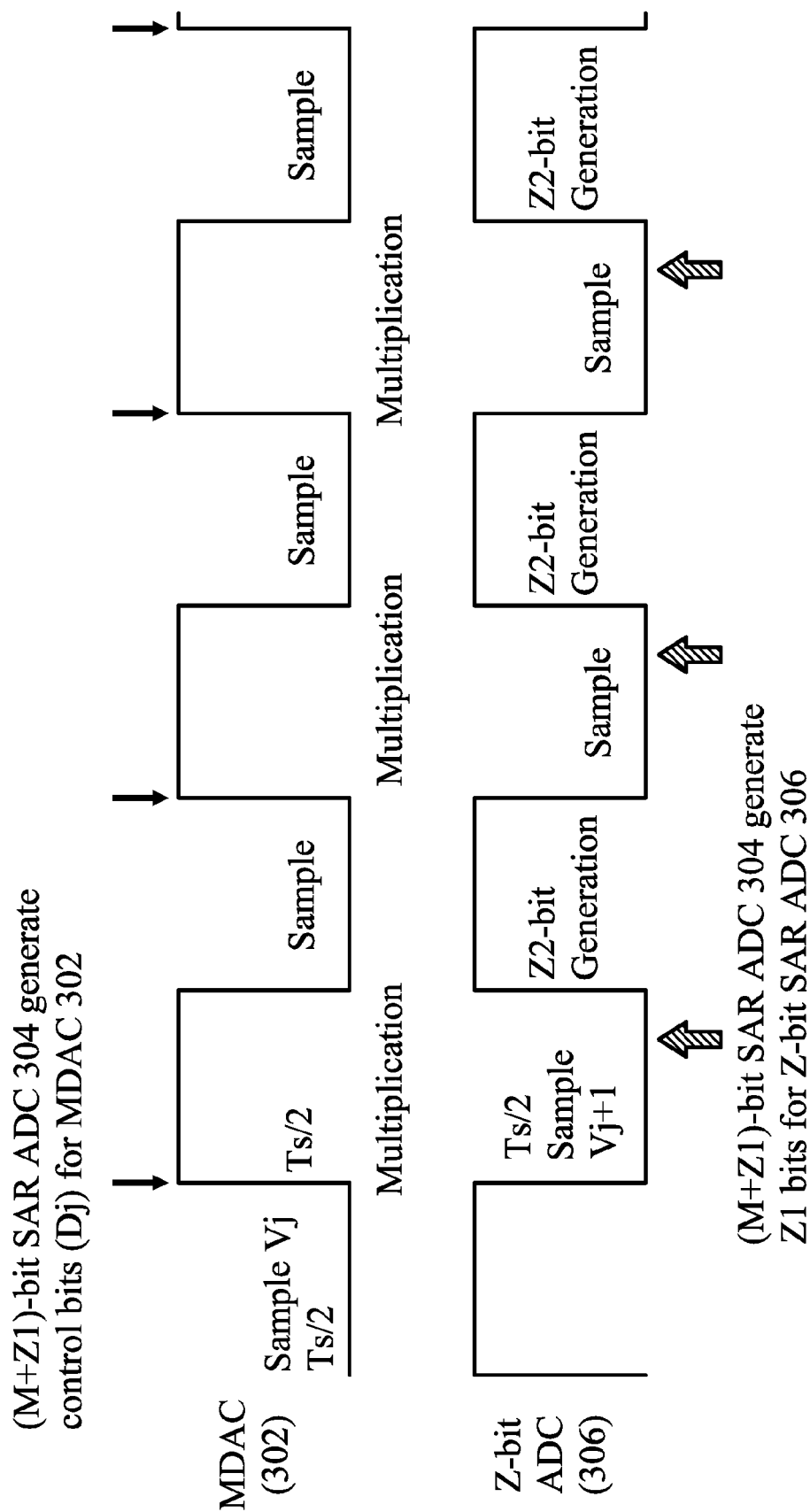
FIG. 4 depicts the timing diagram of the pipelined ADC 300.

FIG. 4 depicts the timing diagram of the pipelined ADC 300. During the sampling phase (that samples the analog input Vj) of the MDAC 302, the (M+Z1)-bit SAR ADC 304 also samples the analog input Vj and, accordingly, generates the control bits (Dj, which may include M bits) for the MDAC 302. Then, the MDAC 102 performs multiplication on the sampled analog input Vj based on the control bits (Dj) and generates a multiplied signal Vj+1 to be sampled by the Z-bit SAR ADC 306. Specifically, in the phase for the MDAC 302 to perform the multiplication and for the Z-bit SAR ADC 306 to sample the multiplied signal Vj+1, the (M+Z1)-bit SAR ADC 304 is utilized to estimate the Z1 bits which are pre-estimated for the Z-bit SAR ADC 306. The pre-estimated Z1 bits are fed to the Z-bit SAR ADC 306. The Z-bit SAR ADC 306, therefore, skips the estimation of the Z1 bits and only needs to estimate the least significant Z2 bits. A high-resolution ADC is achieved without slowing down the conversion speed.

To further speed up the conversion, flash comparators may be adopted in the (M+Z1)-bit SAR ADC 304 for estimation of the most significant M bits. The high-speed flash comparators make the MDAC 300 getting the control bits (Dj) in time. However, to suppress the power consumption of flash comparators, the remaining Z1 bits are still estimated by successive approximation. Because the entire settling time of the multiplied signal Vj+1 can be utilized by the (M+Z1)-bit SAR ADC 304 to estimate the pre-estimated Z1 bits, the successive approximation of the Z1 bits does not drag the conversion speed down.

Figure 5:
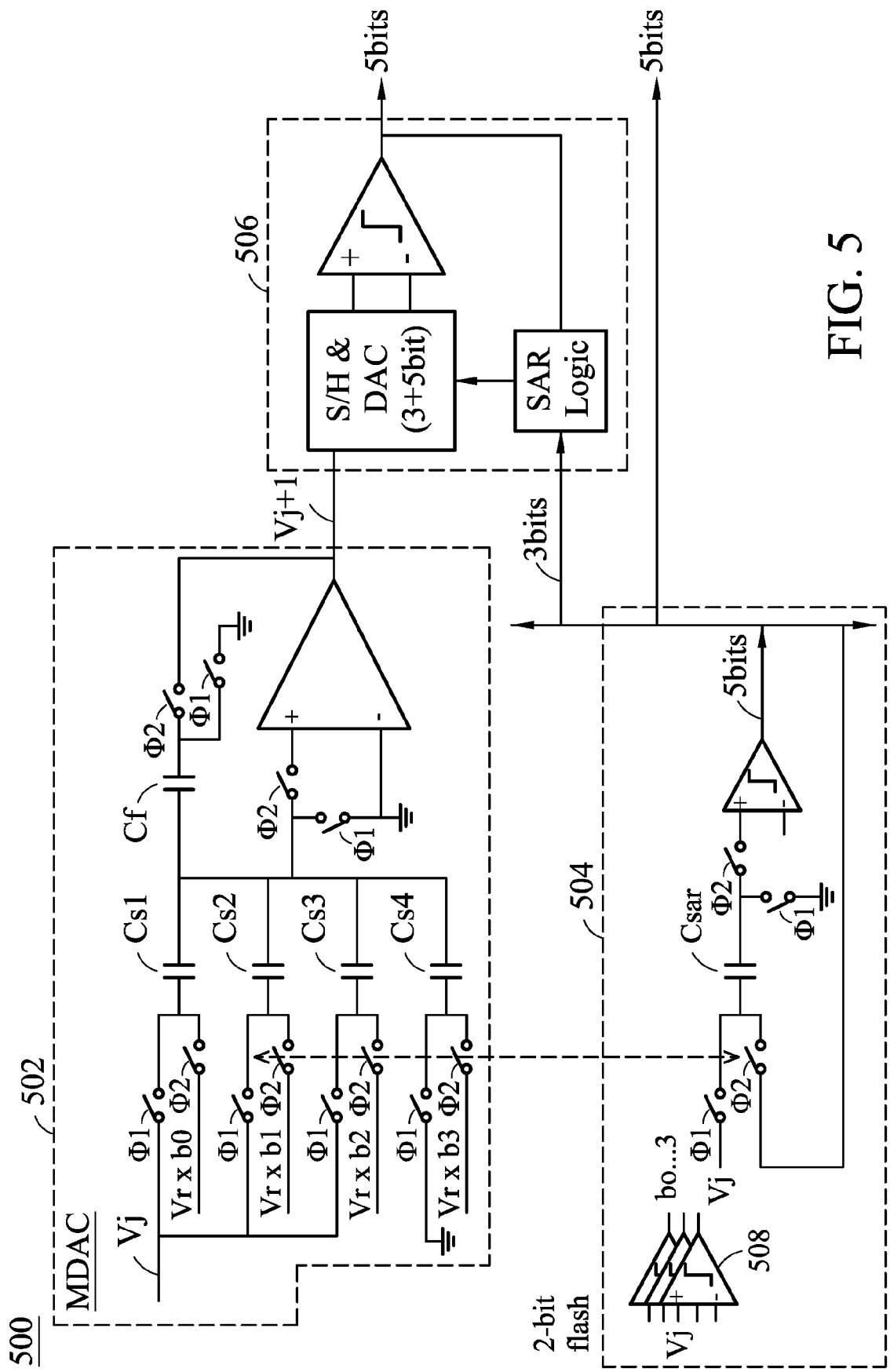
FIG. 5 depicts a pipelined ADC 500 in accordance with another exemplary embodiment of the disclosure.

FIG. 5 depicts a pipelined ADC 500 in accordance with another exemplary embodiment of the disclosure. The pipelined ADC 500 includes an MDAC 502 and two SAR ADCs 504 and 506. An analog input Vj is converted to a digital representation of 10 bits. The SAR ADCs 504 and 506 each estimate 5 bits. As shown, the SAR ADC 506 is in a resolution of 8 (=3+5) bits, greater than 5 bits. The most significant 3 bits are pre-estimated by the SAR ADC 504. Referring to the SAR ADC 504, estimation of 5 bits are required. Flash comparators 508 are provided to rapidly estimate 2 MSBs (most significant bits) to be transferred to the MDAC 502 as control bits. As for the remaining 3 bits which are transferred to the SAR ADC 506 as the pre-estimated 3 bits, the estimation is performed by successive approximation based on the compared results of the flash comparators 508. Because of the high speed of the flash comparators 508, the MDAC 502 gets the required control bits in time. Because the successive approximation of the remaining 3 bits overlaps the operations of the MDAC 302, no additional phase is required for pre-estimating the MSBs of the SAR ADC 506. A high-speed 10-bit ADC is provided.

The SAR ADCs 504 and 506 may further include calibration design. The errors due to the flash comparators 508, over-range redundancy, pre-estimation of digital bits, and incomplete settling of successive approximation may be calibrated by designing the successive approximation structure.

Figure 6:
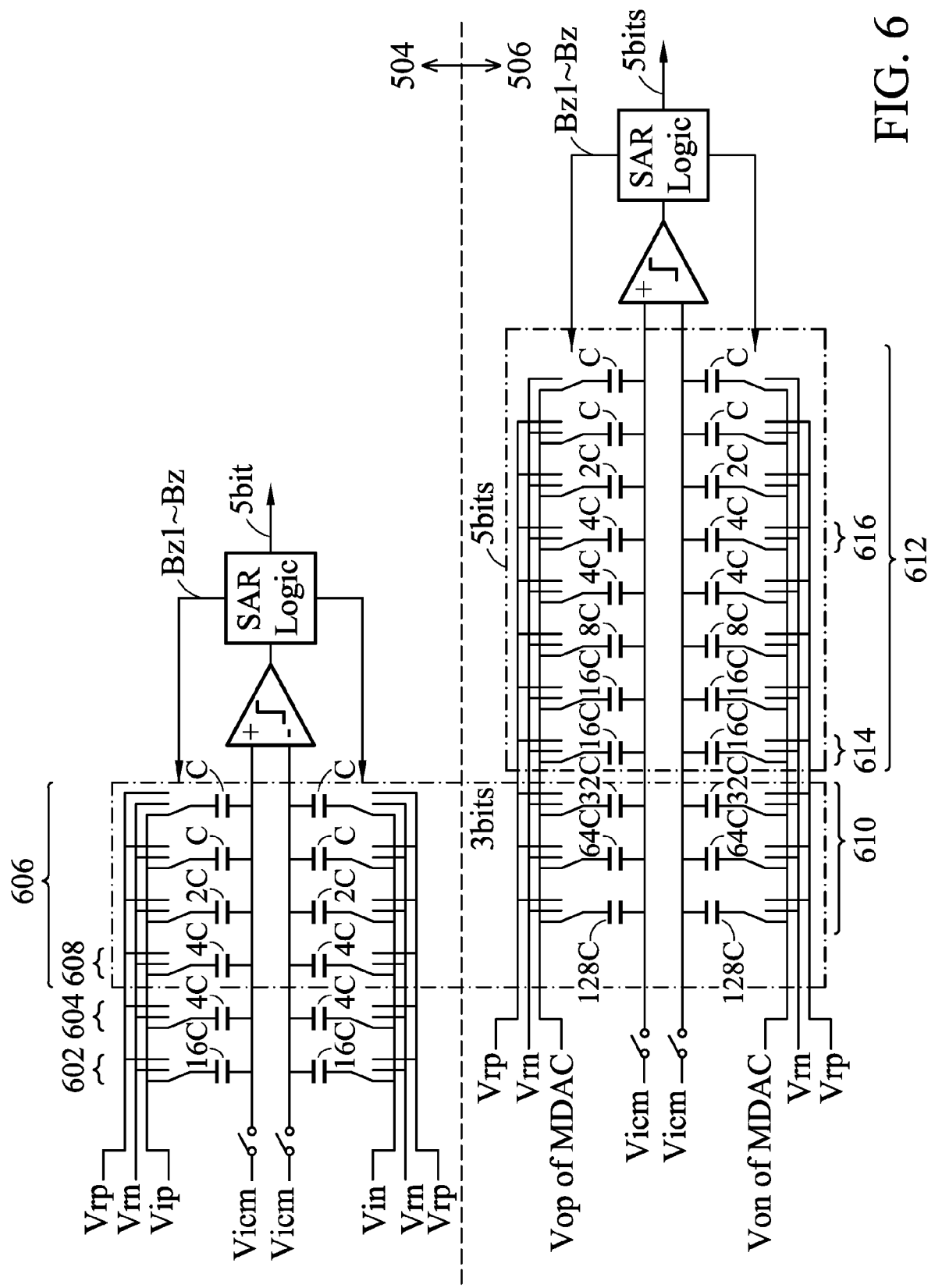
FIG. 6 depicts the capacitive data acquisition architecture of the SAR ADCs 504 and 506 in accordance with an exemplary embodiment of the disclosure.

FIG. 6 depicts the capacitive data acquisition architecture of the SAR ADCs 504 and 506 in accordance with an exemplary embodiment of the disclosure. The capacitors 602 are controlled by the flash comparators 508. The capacitors 604 are provided for calibration of the errors due to the flash comparators 508. Within the capacitors 606 for 3-bit pre-estimation, the capacitors 608 are provided for calibration of errors due to over-range redundancy. The SAR ADC 504 uses front-end successive approximation to estimate the bit controlling the capacitors 604, and uses back-end successive approximation to estimate the bits controlling the capacitors 606. The pre-estimated 3 bits are adopted in the control of the capacitors 610 of the SAR ADC 506. Thus, the front-end successive approximation of the SAR ADC 506 can be skipped. The SAR ADC 506 only needs to perform back-end successive approximation to estimate the bits controlling the capacitors 612. Within the capacitors 612 corresponding to the estimation of the least significant 5 bits of ADC conversion, the capacitors 614 are provided for calibration of errors due to the pre-estimated 3 bits, and the capacitors 616 are provided for calibration of errors due to the incomplete settling of the multiplied signal Vj+1 transferred from an MDAC. The redundancy error may be also suppressed by the incomplete settling calibration. The significant bit regarding redundancy calibration can be lowered. In some exemplary embodiments, some capacitors are provided to form the capacitors 612 for back-end redundant bit successive approximation to calibrate incomplete settling of successive approximation.

The pipelined ADCs of the disclosure further ease the offset errors from the SAR ADCs and the sampling time skew between the MDAC and the SAR ADC controlling the MDAC. Instead of digital timing calibration, the errors are compensated by SAR compensation.

In an exemplary embodiment, the sampling circuit within the SAR ADC controlling the MDAC may be a replica of the sampling circuit within the MDAC, which also effectively reduces the timing skew due to the signal sampling.

In FIG. 6, the capacitive network formed by the capacitors 610 and the capacitive network formed by the capacitors 606 are similar. The difference is the size of the capacitors. The size of the capacitors 610 is 32 times the capacitors 606.

In other exemplary embodiments, the SAR ADCs adopted in the disclosed pipelined ADC may be changed to other type of sub-range ADC. A pipelined ADC using sub-range ADCs according to the aforementioned concept should be considered within the scope of the disclosure.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pipelined analog-to-digital converter, comprising:
    a multiplying digital-to-analog converter, sampling an analog input and performing multiplication on the sampled analog input based on control bits;
    a first sub-range analog-to-digital converter, providing the multiplying digital-to-analog converter with the control bits; and
    a second sub-range analog-to-digital converter, coupled to the multiplying digital-to-analog converter for conversion of a multiplied signal output from the multiplying digital-to-analog converter,
    wherein:
    the first sub-range analog-to-digital converter samples the analog input to generate the control bits for the multiplying digital-to-analog converter as well as pre-estimated bits for the second sub-range analog-to-digital converter;
    the second sub-range analog-to-digital converter operates based on the pre-estimated bits and thereby a first section of digital bits are generated by the second sub-range analog-to-digital converter;
    a second section of digital bits are provided by the first sub-range analog-to-digital converter; and
    the first and second section of digital bits form digital bits representing the analog input.

2. The pipelined analog-to-digital converter as claimed in claim 1, wherein:
    the first section of digital bits are least significant bits of the digital bits representing the analog input; and
    the second section of digital bits are most significant bits of the digital bits representing the analog input.

3. The pipelined analog-to-digital converter as claimed in claim 2, wherein:
    the most significant bits of the digital bits are formed by the control bits and the pre-estimated bits.

4. The pipelined analog-to-digital converter as claimed in claim 1, wherein:
    the first sub-range analog-to-digital converter generates the pre-estimated bits when the multiplying digital-to-analog converter performs the multiplication.

5. The pipelined analog-to-digital converter as claimed in claim 4, wherein:
    when the second sub-range analog-to-digital converter operates based on the pre-estimated bits, the multiplying digital-to-analog converter and the first sub-range analog-to-digital converter proceeds to the next sample of the analog input.

6. The pipelined analog-to-digital converter as claimed in claim 1, wherein:

the first sub-range analog-to-digital converter and the second sub-range analog-to-digital converter are successive approximation register analog-to-digital converters.

7. The pipelined analog-to-digital converter as claimed in claim 6, wherein:
the pre-estimated bits are adopted in the second sub-range analog-to-digital converter to skip front-end successive approximation of the second sub-range analog-to-digital converter.

8. The pipelined analog-to-digital converter as claimed in claim 7, wherein:
the first sub-range analog-to-digital converter uses back-end successive approximation to generate the pre-estimated bits.

9. The pipelined analog-to-digital converter as claimed in claim 8, wherein:
the first sub-range analog-to-digital converter uses front-end successive approximation to generate the control bits.

10. The pipelined analog-to-digital converter as claimed in claim 8, wherein:
the first sub-range analog-to-digital converter comprises flash comparators; and
the control bits are generated by the flash comparators.

11. The pipelined analog-to-digital converter as claimed in claim 10, wherein:
the control bits are further used in the first sub-range analog-to-digital converter to shorten front-end successive approximation of the first sub-range analog-to-digital converter.

12. The pipelined analog-to-digital converter as claimed in claim 11, wherein:
after generating the control bits, the first sub-range analog-to-digital converter uses the front-end successive approximation to calibrate errors due to the flash comparators.

13. The pipelined analog-to-digital converter as claimed in claim 8, wherein:
the back-end successive approximation of the first sub-range analog-to-digital converter is performed when the multiplying digital-to-analog converter performs the multiplication.

14. The pipelined analog-to-digital converter as claimed in claim 13, wherein:
when the second sub-range analog-to-digital converter performs back-end successive approximation to generate the first section of digital bits, the multiplying digital-to-analog converter and the first sub-range analog-to-digital converter proceeds to the next sample of the analog input.

15. The pipelined analog-to-digital converter as claimed in claim 8, wherein:
the first sub-range analog-to-digital converter further uses the back-end successive approximation to calibrate errors due to over-range redundancy.

16. The pipelined analog-to-digital converter as claimed in claim 8, wherein:
the second sub-range analog-to-digital converter further uses the back-end successive approximation to calibrate errors due to the pre-estimated bits.

17. The pipelined analog-to-digital converter as claimed in claim 8, wherein:
the second sub-range analog-to-digital converter further uses back-end redundant bit successive approximation to calibrate incomplete settling of successive approximation.

* * * * *